US010973119B2

(12) United States Patent
Sato et al.

(10) Patent No.: US 10,973,119 B2
(45) Date of Patent: Apr. 6, 2021

(54) ELECTRONIC CIRCUIT BOARD, ACCELERATION SENSOR, INCLINOMETER, INERTIAL NAVIGATION DEVICE, STRUCTURE MONITORING DEVICE, AND VEHICLE

(71) Applicant: Seiko Epson Corporation, Tokyo (JP)

(72) Inventors: Kenta Sato, Shiojiri (JP); Yasushi Yoshikawa, Chino (JP)

(73) Assignee: Seiko Epson Corporation

(*) Notice: Subject to any disclaimer, the term of this patent is extended or adjusted under 35 U.S.C. 154(b) by 0 days.

(21) Appl. No.: 16/280,109

(22) Filed: Feb. 20, 2019

(65) Prior Publication Data

US 2019/0261508 A1 Aug. 22, 2019

(30) Foreign Application Priority Data

Feb. 21, 2018 (JP) .............................. JP2018-028930

(51) Int. Cl.
*H03B 1/00* (2006.01)
*H05K 1/02* (2006.01)
*H05K 1/11* (2006.01)
*H03B 5/02* (2006.01)
*H03B 5/32* (2006.01)

(52) U.S. Cl.
CPC ............ *H05K 1/0298* (2013.01); *H03B 5/02* (2013.01); *H03B 5/32* (2013.01); *H05K 1/115* (2013.01)

(58) Field of Classification Search
CPC ............... H05K 1/0298; H05K 1/115; H05K 2201/10075; H05K 2201/10166; H05K 2201/10151; H05K 2201/09327; H05K 1/0224; H05K 1/0237; H03B 5/32; H03B 5/02; G01C 9/08; G01C 21/165
USPC ........................................................ 331/68
See application file for complete search history.

(56) References Cited

U.S. PATENT DOCUMENTS

| 2003/0098750 A1 | 5/2003 | Hayafuji et al. |
| 2004/0051595 A1* | 3/2004 | Yoshimine ........... G01N 29/036 331/158 |
| 2005/0272399 A1* | 12/2005 | Murata .................... H03B 5/36 455/333 |

(Continued)

FOREIGN PATENT DOCUMENTS

| JP | 2003-163538 A | 6/2003 |
| JP | 2006-270598 A | 10/2006 |

(Continued)

*Primary Examiner* — Richard Tan
(74) *Attorney, Agent, or Firm* — Harness, Dickey & Pierce, P.L.C.

(57) ABSTRACT

An electronic circuit board includes a substrate having a multilayer structure including a ground layer, has at least one configuration in which, in a ground layer closest to a signal terminal of an oscillator, a region overlapping a signal terminal in a plan view is a non-forming region of a ground electrode, in a ground layer closest to a first wiring connecting the signal terminal of the oscillator and an input portion of an amplifier, a region overlapping the first wiring in the plan view is a non-forming region of a ground electrode, and in a ground layer closest to a second wiring connecting the signal terminal of the oscillator and an output portion of the amplifier, a region overlapping the second wiring in the plan view is a non-forming region of a ground electrode.

20 Claims, 15 Drawing Sheets

(56) References Cited

U.S. PATENT DOCUMENTS

| | | | | |
|---|---|---|---|---|
| 2006/0097906 A1* | 5/2006 | Heide | ............... | G01S 7/032 |
| | | | | 342/22 |
| 2011/0081969 A1* | 4/2011 | Ikeda | ............... | A63F 13/235 |
| | | | | 463/37 |
| 2011/0285444 A1* | 11/2011 | Uemura | ............ | G01C 19/5614 |
| | | | | 327/299 |
| 2013/0215587 A1* | 8/2013 | Kawai | ............... | H05K 1/115 |
| | | | | 361/783 |
| 2014/0368283 A1* | 12/2014 | Shimodaira | ............ | H03H 9/17 |
| | | | | 331/70 |
| 2017/0191832 A1 | 7/2017 | Kinoshita et al. | | |
| 2018/0118220 A1* | 5/2018 | Kimura | ............... | B60W 10/20 |

FOREIGN PATENT DOCUMENTS

| | | |
|---|---|---|
| JP | 2014-085233 A | 5/2014 |
| JP | 2015-143661 A | 8/2015 |
| JP | 2017-020829 A | 1/2017 |
| JP | 2017-151041 A | 8/2017 |

\* cited by examiner

ELECTRONIC CIRCUIT BOARD,
ACCELERATION SENSOR, INCLINOMETER,
INERTIAL NAVIGATION DEVICE,
STRUCTURE MONITORING DEVICE, AND
VEHICLE

BACKGROUND

1. Technical Field

The present invention relates to an electronic circuit board and the like.

2. Related Art

In a multilayered electronic circuit board, circuits are close to each other and thus, noise countermeasures are important. For example, as described in JP-A-2003-163538, a technology for reducing occurrence of high frequency noise by using a planar ground electrode in which a wide region called "ground solid" or "solid ground" (hereinafter, referred to as "ground solid") is filled as one area, in an electronic circuit board on which an oscillator is mounted is known. The oscillator is an element or a circuit that outputs oscillation of a predetermined frequency by applying a voltage.

However, the noise countermeasure technology of JP-A-2003-163538 is not necessarily effective in some cases. For example, in a case where a plurality of oscillators are mounted on one electronic circuit board, sufficient effects may not be obtained in some cases. In a case where the plurality of oscillators having the same or close oscillation frequency are mounted at positions physically close to each other, there is a concern that countermeasures such as widening an area of the ground solid and the like may cause interference noise and the like to lead to deterioration of noise countermeasures.

SUMMARY

An advantage of some aspects of the invention is to solve at least a part of the problems described above, and the invention can be implemented as the following aspects or application examples.

An electronic circuit board according to an aspect of the invention includes a substrate having a multilayer structure including at least one ground layer, and an oscillation circuit provided on the substrate, in which the oscillation circuit includes an oscillator and a circuit including an amplifier connected to a signal terminal of the oscillator, and a ground layer closest to the signal terminal in the multilayer structure has a first ground electrode configuration in which a region that overlaps the signal terminal in a plan view when viewed in a direction perpendicular to a substrate surface is a non-forming region of a ground electrode.

According to the aspect of the invention, the ground electrode is not formed at a position physically close to the oscillator such that interference noise exerted by an output signal from the oscillator to other element through the ground electrode can be reduced.

An electronic circuit board according to another aspect of the invention includes a substrate having a multilayer structure including at least one ground layer, and an oscillation circuit provided on the substrate, in which the oscillation circuit includes an oscillator and a circuit including an amplifier connected to a signal terminal of the oscillator, and a ground layer closest to a first wiring connecting the signal terminal and an input portion of the amplifier in the multilayer structure has a second ground electrode configuration in which a region that overlaps the first wiring in the plan view is a non-forming region of a ground electrode.

According to the aspect of the invention, the ground electrode is not formed at a position physically close to the oscillator such that interference noise exerted by the output signal from the oscillator to other element through the ground electrode can be reduced.

An electronic circuit board according to another aspect of the invention includes a substrate having a multilayer structure including at least one ground layer, and an oscillation circuit provided on the substrate, in which the oscillation circuit includes an oscillator and a circuit including an amplifier connected to a signal terminal of the oscillator, and a ground layer closest to a second wiring connecting the signal terminal and an output portion of the amplifier in the multilayer structure has a third ground electrode configuration in which a region that overlaps the second wiring in the plan view is a non-forming region of a ground electrode.

According to the aspect of the invention, the ground electrode is not formed at a position physically close to the oscillator such that interference noise exerted by the output signal from the oscillator to other element through the ground electrode can be reduced.

An electronic circuit board according to another aspect of the invention includes a substrate having a multilayer structure including at least one ground layer, and an oscillation circuit provided on the substrate, in which the oscillation circuit includes an oscillator and a circuit including an amplifier connected to a signal terminal of the oscillator, and a ground layer closest to the signal terminal in the multilayer structure has a first ground electrode configuration in which a region that overlaps the signal terminal in a plan view when viewed in a direction perpendicular to a substrate surface is a non-forming region of a ground electrode, a ground layer closest to a first wiring connecting the signal terminal and an input portion of the amplifier in the multilayer structure has a second ground electrode configuration in which a region that overlaps the first wiring in the plan view is a non-forming region of a ground electrode, and a ground layer closest to a second wiring connecting the signal terminal and an output portion of the amplifier in the multilayer structure has a third ground electrode configuration in which a region that overlaps the second wiring in the plan view is a non-forming region of a ground electrode.

According to the aspect of the invention, since the first ground electrode configuration, the second ground electrode configuration, and the third ground electrode configuration are provided, noise can be more effectively reduced than in the first invention.

In the electronic circuit board according to the aspect of the invention, in a ground layer closest to a pad of the circuit in the multilayer structure, a region that overlaps the pad in the plan view may be a non-forming region of a ground electrode.

The "pad" is a portion for soldering an electronic component to a substrate in a thin film-like wiring connecting electronic components on the substrate and is synonymous with a "land".

According to the aspect of the invention with this configuration, noise can be further reduced by including a region where a non-forming region of a ground electrode overlaps the pad.

In the electronic circuit board according to the aspect of the invention, a plurality of the oscillation circuits may be provided, and a ground wiring of each oscillator may be independently connected to a common ground portion.

According to the aspect of the invention with this configuration, noise can be reduced more effectively.

In the electronic circuit board according to the aspect of the invention, a regulator for supplying power to the oscillation circuit may be provided for each oscillation circuit.

According to the aspect of the invention with this configuration, the influence from the regulator can also be reduced.

In the electronic circuit board according to the aspect of the invention, the oscillator may be a physical quantity sensor element that outputs a signal corresponding to a predetermined physical quantity.

According to the aspect of the invention with this configuration, it is possible to realize an electronic circuit board on which a physical quantity sensor is mounted and which can obtain the same effect as the electronic circuit board.

In the electronic circuit board according to the aspect of the invention, the physical quantity may be acceleration.

According to the aspect of the invention with this configuration, it is possible to realize an electronic circuit board on which a sensor for detecting acceleration is mounted and which can obtain the same effect as the electronic circuit board.

An acceleration sensor according to another aspect of the invention includes the electronic circuit board and an accommodator accommodating the electronic circuit board.

According to the aspect of the invention with this configuration, a packaged acceleration sensor capable of obtaining the same effect as that of the electronic circuit board can be realized and acceleration detection accuracy can be improved as compared with the related art.

An inclinometer according to another aspect of the invention includes the acceleration sensor and a calculator that calculates an inclination angle based on an output signal of the acceleration sensor.

According to the aspect of the invention, by using the acceleration sensor, detection accuracy of the inclination angle can be improved as compared with the related art.

An inertial navigation device according to another aspect of the invention is an inertial navigation device which is attached to a vehicle and includes the acceleration sensor, an angular velocity sensor, a circuit unit for calculating an attitude of the vehicle based on an output signal of the acceleration sensor and an output signal of the angular velocity sensor.

According to the aspect of the invention, by using the acceleration sensor, accuracy of inertial navigation can be improved as compared with the related art.

A structure monitoring device according to another aspect of the invention includes the acceleration sensor attached to a structure, a transmitter attached to the structure and transmitting a detection signal of the acceleration sensor, a receiver that receives a transmission signal from the transmitter, and a calculator that calculates an inclination angle of the structure based on a received signal of the receiver.

According to the aspect of the invention, by using the acceleration sensor, the inclination angle of the structure can be detected more accurately as compared with the related art.

A vehicle according to another aspect of the invention includes the acceleration sensor and a controller that controls at least one of acceleration, braking, and steering based on a detection signal of the acceleration sensor, in which switching of the execution or non-execution of an automatic operation is performed based on the detection signal of the acceleration sensor.

According to the aspect of the invention, by using the acceleration sensor for controlling an automatic operation, a quality of the automatic operation can be improved as compared with the related art.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Figure 1:
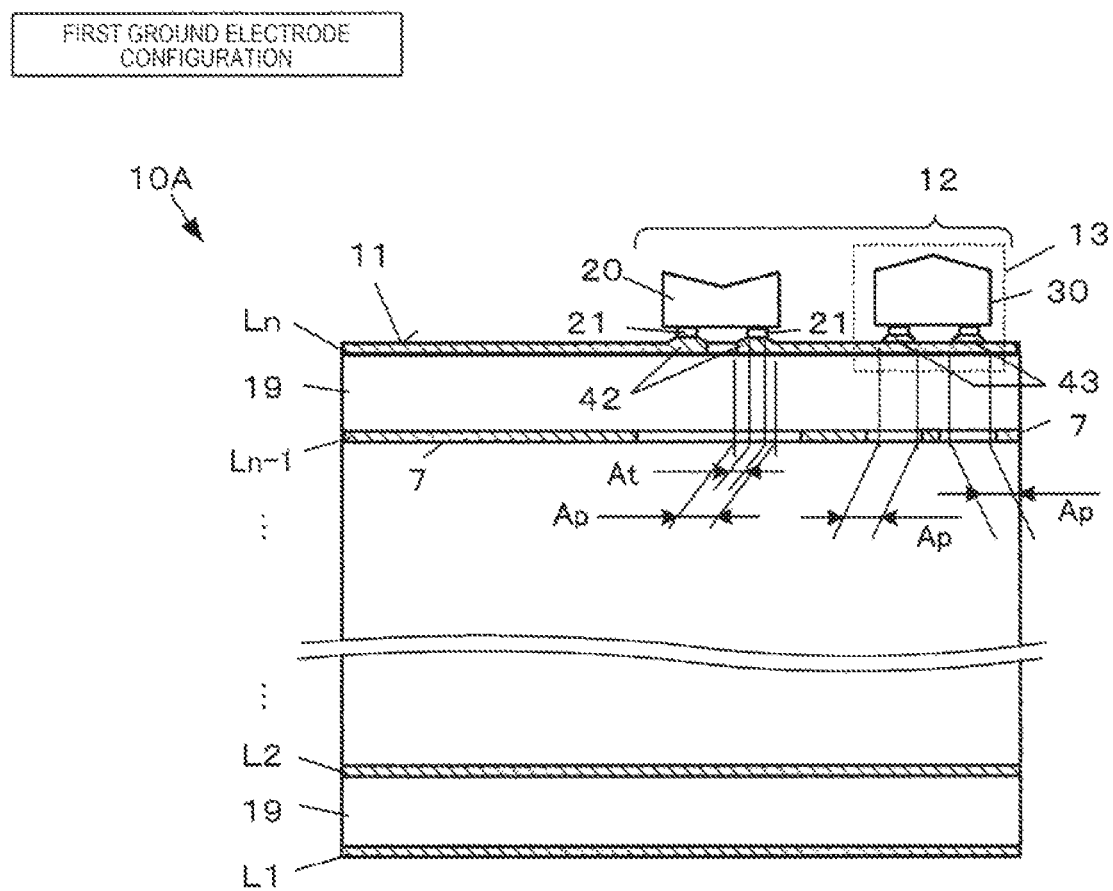
FIG. 1 is a schematic view for explaining a first ground electrode configuration.

Hereinafter, preferred embodiments of the invention will be described with reference to the drawings. The invention is not limited by the embodiments described below, and aspects to which the invention can be applied are not limited to the following embodiments. In the description of the drawings, the same reference numerals are given to the same elements.

Description of Principle

First, the principle for achieving noise reduction in this embodiment will be described.

FIG. 1 is a schematic view for explaining a first ground electrode configuration which is an element for reducing noise. For the sake of clarity, a thickness of an insulating layer is illustrated largely. An electronic circuit board 10A is an electronic circuit board of a multilayer structure having a first layer L1 to an n-th layer Ln (n is an integer of 2 or more).

In the electronic circuit board 10A, the oscillation circuit 12 is mounted on a substrate surface 11 of the n-th layer Ln, that is, the upper surface of the electronic circuit board, and an upper ground layer 7 is provided in an (n−1)-th layer Ln−1.

An oscillation circuit 12 includes an oscillator 20 and a circuit 13 having an amplifier 30.

The oscillator 20 is soldered to a pad 42 provided on the substrate surface 11 by a signal terminal 21. The amplifier 30 is also soldered to a pad 43 provided on the substrate surface 11 by an input portion 31 and an output portion 32. Also, the oscillation circuit 12 may be configured to include other electronic components.

In the electronic circuit board 10A, the upper ground layer 7 closest to the signal terminal 21 of the oscillator 20 in the multilayer structure has a configuration in which a signal terminal overlapping region At which overlaps the signal terminal 21 in a plan view when viewed in a direction perpendicular to the substrate surface 11 is set as a non-forming region of a ground electrode. This configuration is referred to as a "first ground electrode configuration".

In the electronic circuit board 10A, the upper ground layer 7 closest to the pad 42 of the signal terminal 21 and the pad 43 of the electronic component constituting the circuit 13 having the amplifier 30 in the multilayer structure has a configuration in which a pad overlapping region Ap which overlaps these components in the plan view described above is set as a non-forming region of a ground electrode.

By forming a non-forming region which is, as it were, a "punched region" of the electrode in the upper ground layer 7 closest to the oscillator 20, it is possible to reduce electromagnetic influence of a high frequency generated by the operation of the oscillator 20 exerted on other electronic components through the ground electrode. Therefore, in the electronic circuit board 10A, noise can be reduced as compared with the configuration in which the non-forming region is not provided in the ground electrode. In this embodiment, the pad 43 of the electronic component constituting the circuit 13 having the amplifier 30 also forms the non-forming region in the closest upper ground layer 7, and noise can be further reduced as compared with providing the non-forming region in only one of the pad 42 and the pad 43 in the upper ground layer 7.

A configuration in which a non-forming region is provided in the upper ground layer 7 only for one of the pad 42 or the pad 43 may be adopted as long as no problem arises due to low noise.

Figure 2:
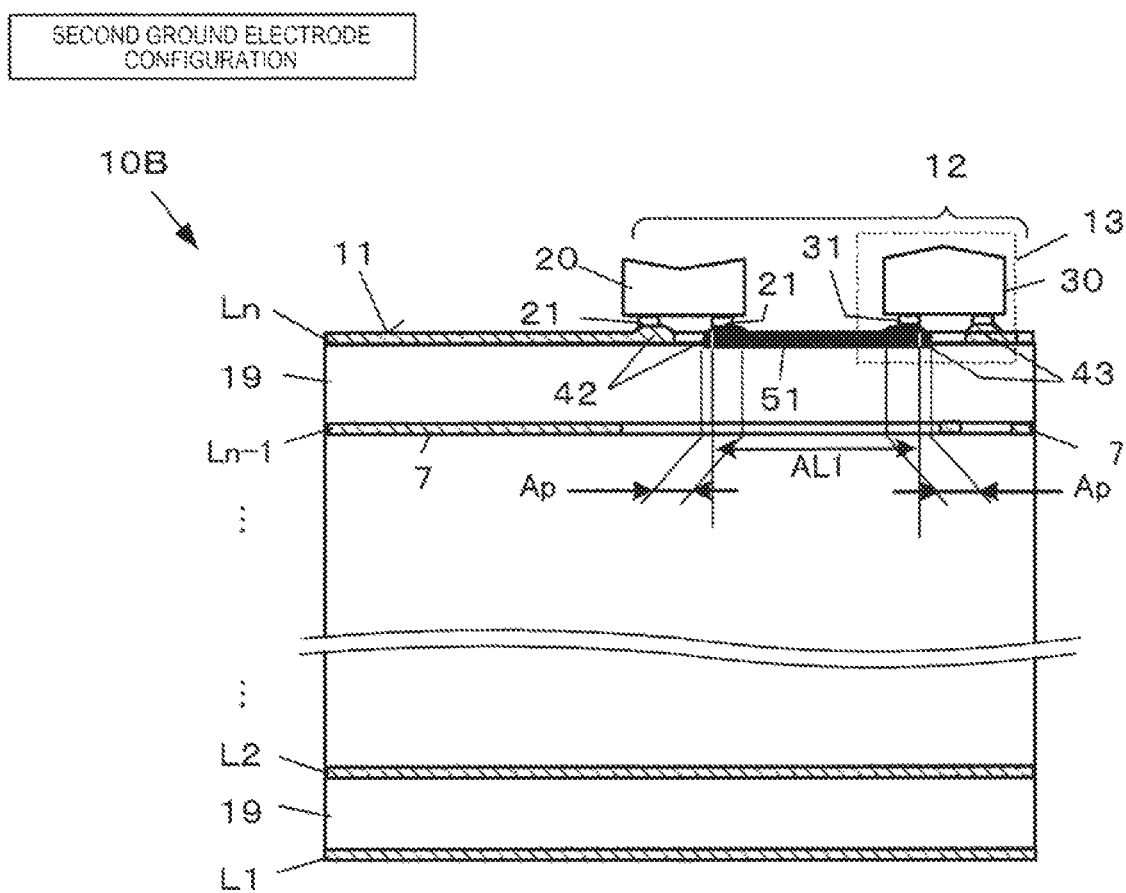
FIG. 2 is a schematic view for explaining a second ground electrode configuration.

FIG. 2 is a schematic view for explaining a second ground electrode configuration which is an element for reducing noise. The electronic circuit board 10B has a multilayer structure similar to that of the electronic circuit board 10A, and the oscillation circuit 12 is mounted on a substrate surface 11 of the n-th layer Ln, that is, the upper surface of the electronic circuit board, and an upper ground layer 7 is provided in an (n−1)-th layer Ln−1.

The oscillation circuit 12 includes an oscillator 20 and a circuit 13 having an amplifier 30.

The oscillator 20 is soldered to a pad 42 provided on the substrate surface 11 by a signal terminal 21. The amplifier 30 is also soldered to a pad 43 provided on the substrate surface 11 by an input portion 31 and an output portion 32. Also, the oscillation circuit 12 may be configured to include other electronic components.

In the electronic circuit board 10B, the upper ground layer 7 closest to a first wiring 51 connecting the signal terminal 21 and the input portion 31 of the amplifier 30 in the multilayer structure has a configuration in which a first wiring overlapping region AL1 which overlaps the first wiring 51 in a plan view is set as a non-forming region of the upper ground layer 7.

Similarly to the electronic circuit board 10A, the upper ground layer 7 closest to the pad 42 of the signal terminal 21 and the pad 43 of the electronic component constituting the circuit 13 having the amplifier 30 in the multilayer structure has a configuration in which the pad overlapping region Ap which overlaps these components in the plan view described above is set as a non-forming region of a ground electrode. A configuration in which a non-forming region is provided in the upper ground layer 7 only for one of the pad 42 or the pad 43 may be adopted as long as no problem arises due to low noise.

Accordingly, also in the electronic circuit board 10B, a noise reduction effect similar to that of the electronic circuit board 10A can be obtained. Furthermore, since the first wiring overlapping region AL1 is included in the non-forming region of the ground electrode, the noise reduction effect is larger than that of the electronic circuit board 10A as much as the first wiring overlapping region AL1 is included in the non-forming region of the ground electrode.

Figure 3:
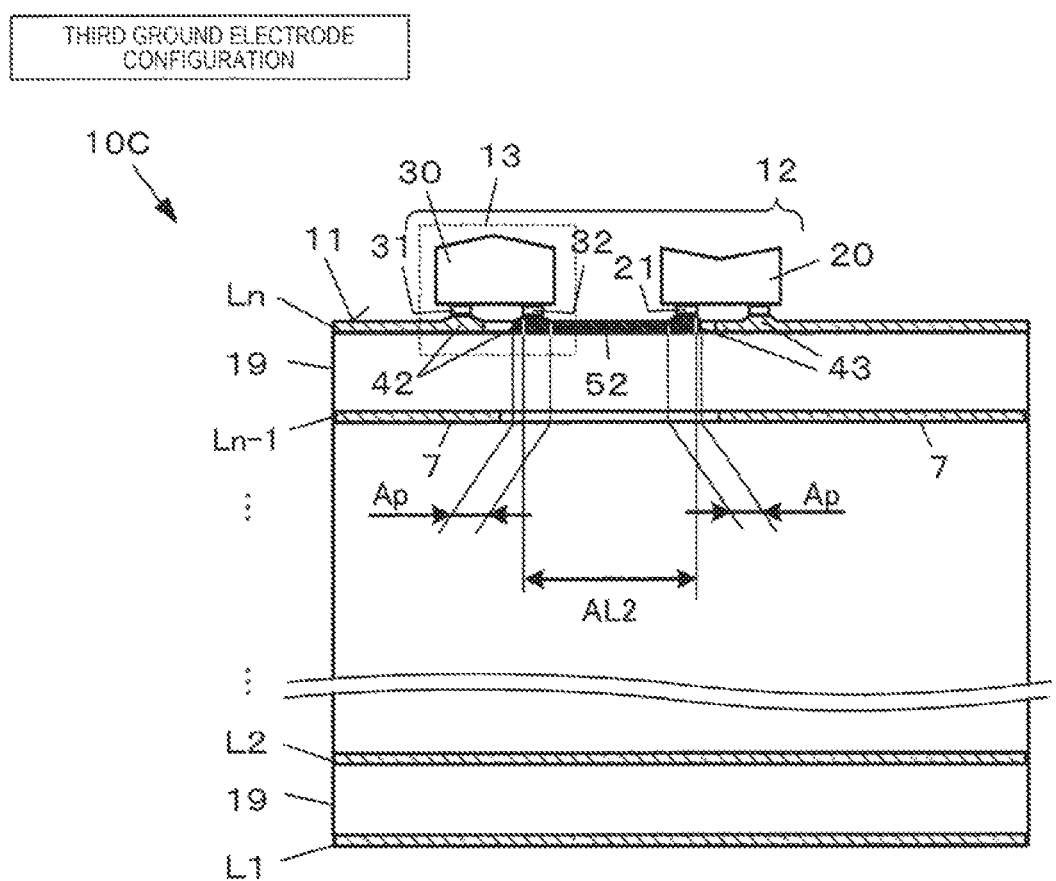
FIG. 3 is a schematic view for explaining a third ground electrode configuration.

FIG. 3 is a schematic view for explaining a third ground electrode configuration which is an element for reducing noise. The electronic circuit board 10C has a multilayer structure similar to that of the electronic circuit board 10A, and the oscillation circuit 12 is mounted on a substrate surface 11 of the n-th layer Ln, that is, the upper surface of the electronic circuit board, and an upper ground layer 7 is provided in an (n−1)-th layer Ln−1.

The oscillation circuit 12 includes the oscillator 20 and the circuit 13 having an amplifier 30.

The oscillator 20 is soldered to the pad 42 provided on the substrate surface 11 by the signal terminal 21. The amplifier 30 is also soldered to the pad 43 provided on the substrate surface 11 by the input portion 31 and the output portion 32. Also, the oscillation circuit 12 may be configured to include other electronic components.

In the electronic circuit board 10C, the upper ground layer 7 closest to the second wiring 52 connecting the signal terminal 21 and the output portion 32 of the amplifier 30 in the multilayer structure has a configuration in which a second wiring overlapping region AL2 which overlaps the second wiring 52 in a plan view is set as a non-forming region of the upper ground layer 7.

Similarly to the electronic circuit board 10A, the upper ground layer 7 closest to the pad 42 of the signal terminal 21 and the pad 43 of the electronic component constituting the circuit 13 having the amplifier 30 in the multilayer structure has a configuration in which the pad overlapping region Ap which overlaps these components in the plan view described above is set as a non-forming region of a ground electrode. A configuration in which a non-forming region is provided in the upper ground layer 7 only for one of the pad 42 or the pad 43 may be adopted as long as no problem arises due to low noise.

Accordingly, also in the electronic circuit board 10C, a noise reduction effect similar to that of the electronic circuit board 10A can be obtained. Furthermore, since the second wiring overlapping region AL2 is included in the non-forming region of the ground electrode, the noise reduction effect is larger than that of the electronic circuit board 10A as much as the second wiring overlapping region AL2 is included in the non-forming region of the ground electrode.

Figure 4:
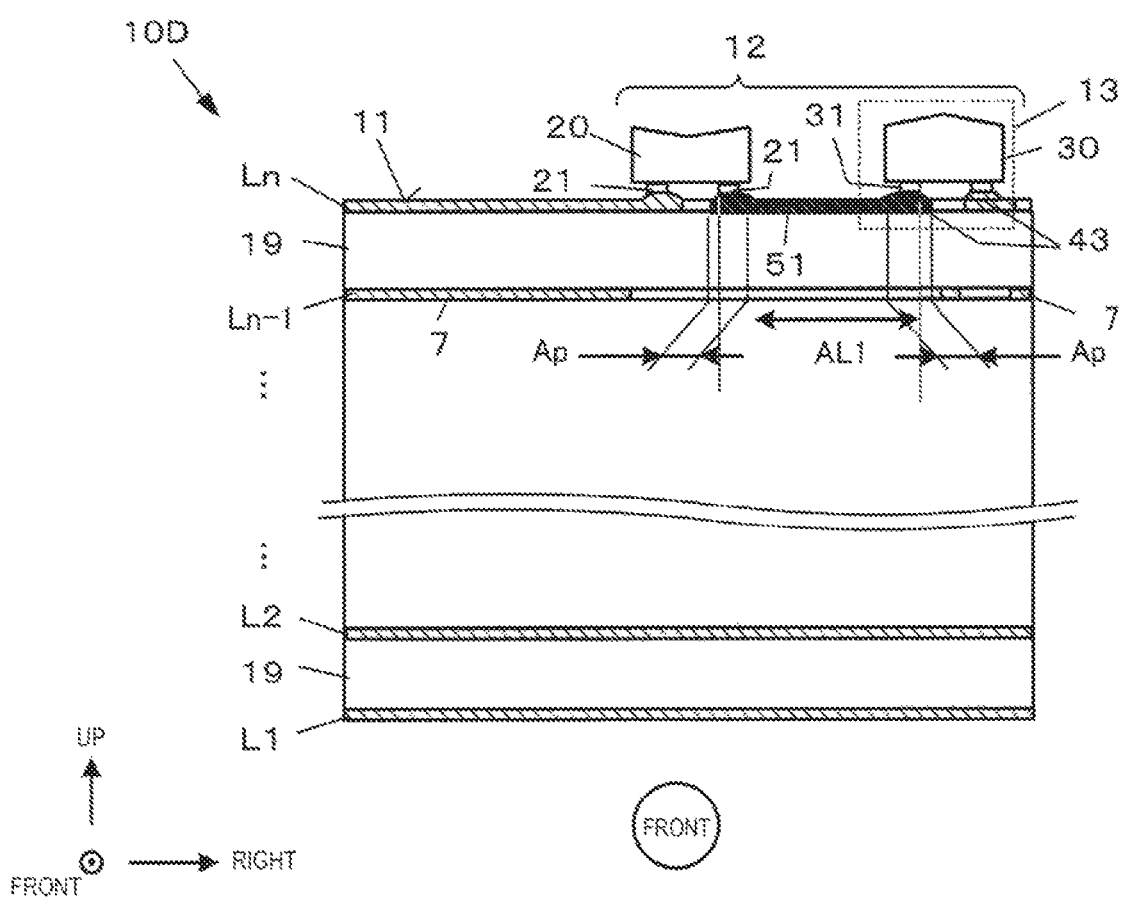
FIG. 4 is a schematic view (corresponding to a front view) for explaining a first example in which all of the first ground electrode configuration, the second ground electrode configuration, and the third ground electrode configuration are applied.
Figure 5:
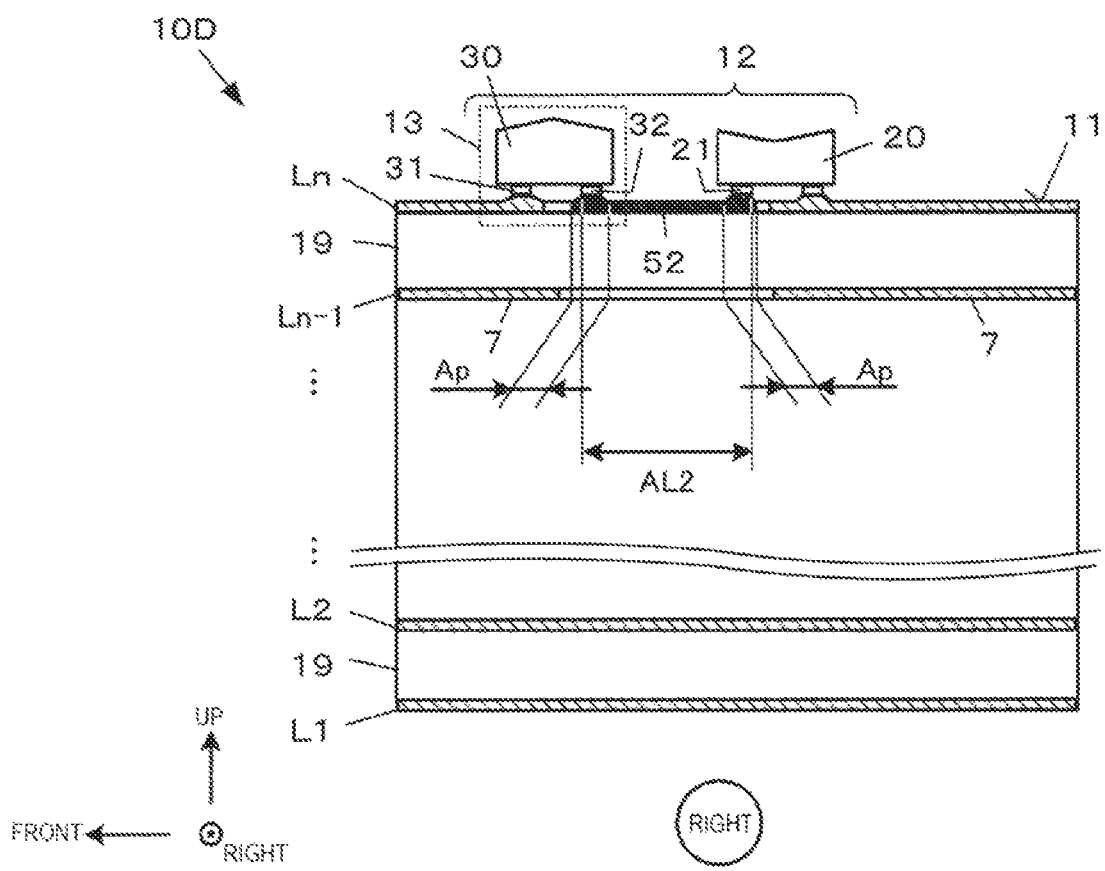
FIG. 5 is a schematic view (corresponding to a side view) for explaining the first example to which all of the first ground electrode configuration, the second ground electrode configuration, and the third ground electrode configuration are applied.

FIGS. 4 and 5 are schematic views for explaining a first example in which all the ground electrode configurations of the first ground electrode configuration, the second ground electrode configuration, and the third ground electrode configuration are applied. FIG. 4 is a front view, and FIG. 5 is a side view when viewed toward the front and viewed from the front.

The electronic circuit board 10D has the entire configuration of the first ground electrode configuration, the second ground electrode configuration, and the third ground electrode configuration. Therefore, in the electronic circuit board 10D, a noise reduction effect similar to at least the electronic circuit board 10A can be obtained. Furthermore, since the first wiring overlapping region AL1 and the second wiring overlapping region AL2 are included in the non-forming region of the ground, the noise reduction effect is larger than those of the electronic circuit board 10A, the electronic circuit board 10B, and the electronic circuit board 10C electrode as much as the first wiring overlapping region AL1 and the second wiring overlapping region AL2 are included in the non-forming region of the ground electrode.

Figure 6:
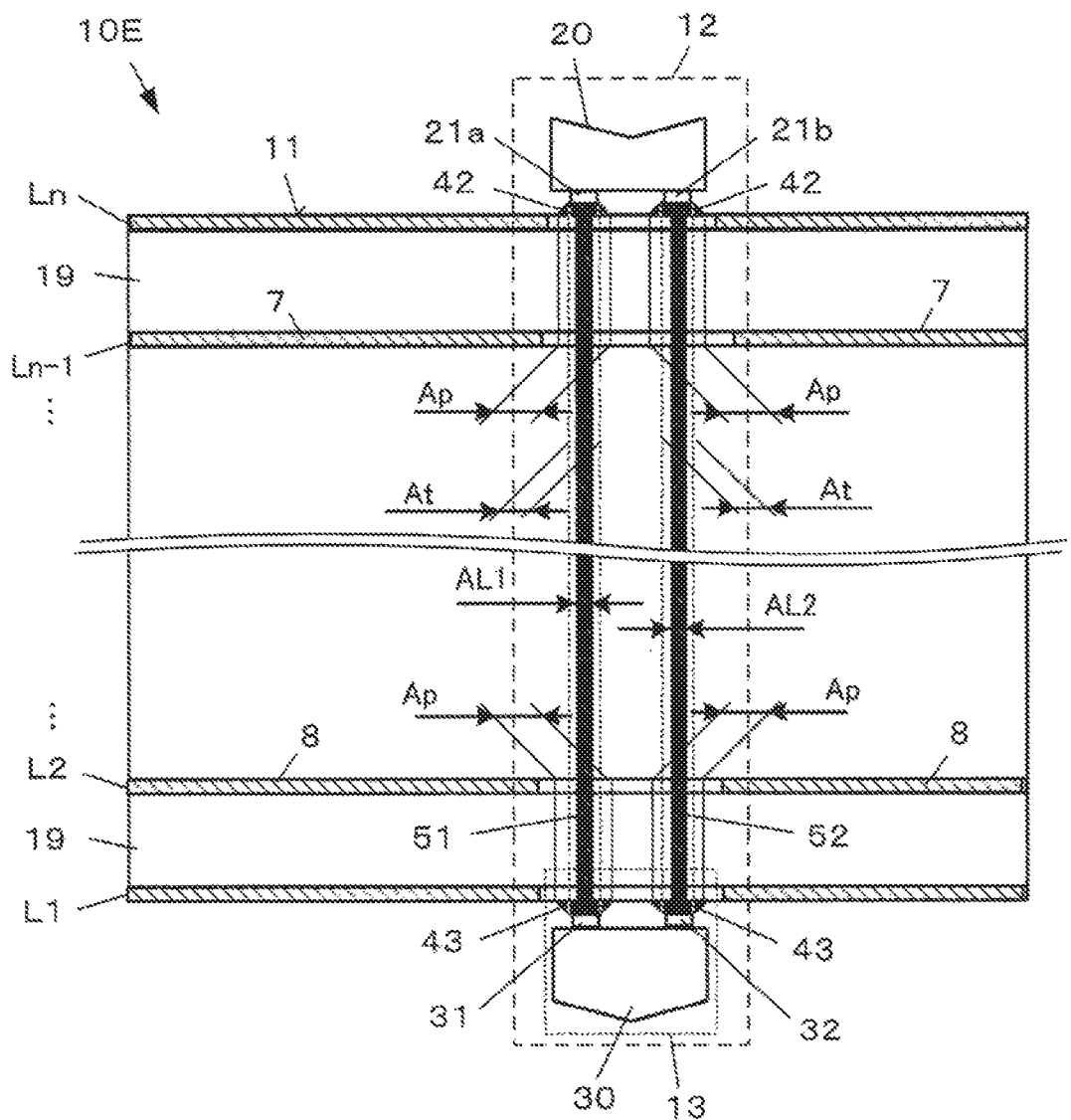
FIG. 6 is a schematic view for explaining a second example to which all of the first ground electrode configuration, the second ground electrode configuration, and the third ground electrode configuration are applied.

FIG. 6 is a schematic view for explaining a second example in which all the ground electrode configurations of the first ground electrode configuration, the second ground electrode configuration, and the third ground electrode configuration are applied.

An electronic circuit board 10E has all the ground electrode configurations of the first ground electrode configuration, the second ground electrode configuration, and the third ground electrode configuration. However, the oscillator 20 of the oscillation circuit 12 is mounted on the upper surface of the electronic circuit board 10E, that is, the substrate surface 11 of the n-th layer Ln, and the amplifier 30 and the circuit 13 including the amplifier 30 are mounted on the lower surface of the electronic circuit board 10E, that is, the substrate surface 11 of the first layer L1. The ground layer closest to the amplifier 30 and the circuit 13 including the amplifier 30 is the lower ground layer 8 of the second layer L2. The first wiring 51 and the second wiring 52 connecting the oscillator 20 and the amplifier 30 are prepared as vias penetrating layers between the first layer L1 and the n-th layer Ln.

In the electronic circuit board 10E, a noise reduction effect similar to at least the electronic circuit board 1 OA can be obtained. Furthermore, since the first wiring overlapping region AL1 and the second wiring overlapping region AL2 are included in the non-forming region of the ground electrode, the noise reduction effect is larger than those of the electronic circuit board 10A, the electronic circuit board 10B, and the electronic circuit board 10C as much as the first wiring overlapping region AL1 and the second wiring overlapping region AL2 are included in the non-forming region of the ground electrode.

In FIG. 1 to FIG. 6, although only one oscillator circuit 12 is illustrated, a configuration in which a plurality of oscillation circuits 12 are mounted is also possible. An electronic circuit board that employs two predetermined ground electrode configurations among the three ground electrode configurations of the first ground electrode configuration, the second ground electrode configuration, and the third ground electrode configuration may be configured.

First Embodiment

Next, as a first embodiment, an acceleration sensor 100 using an electronic circuit board having all three ground electrode configurations of a first ground electrode configuration, a second ground electrode configuration, and a third ground electrode configuration as a physical quantity sensor element that outputs a signal corresponding to a predetermined physical quantity is exemplified.

Figure 7:
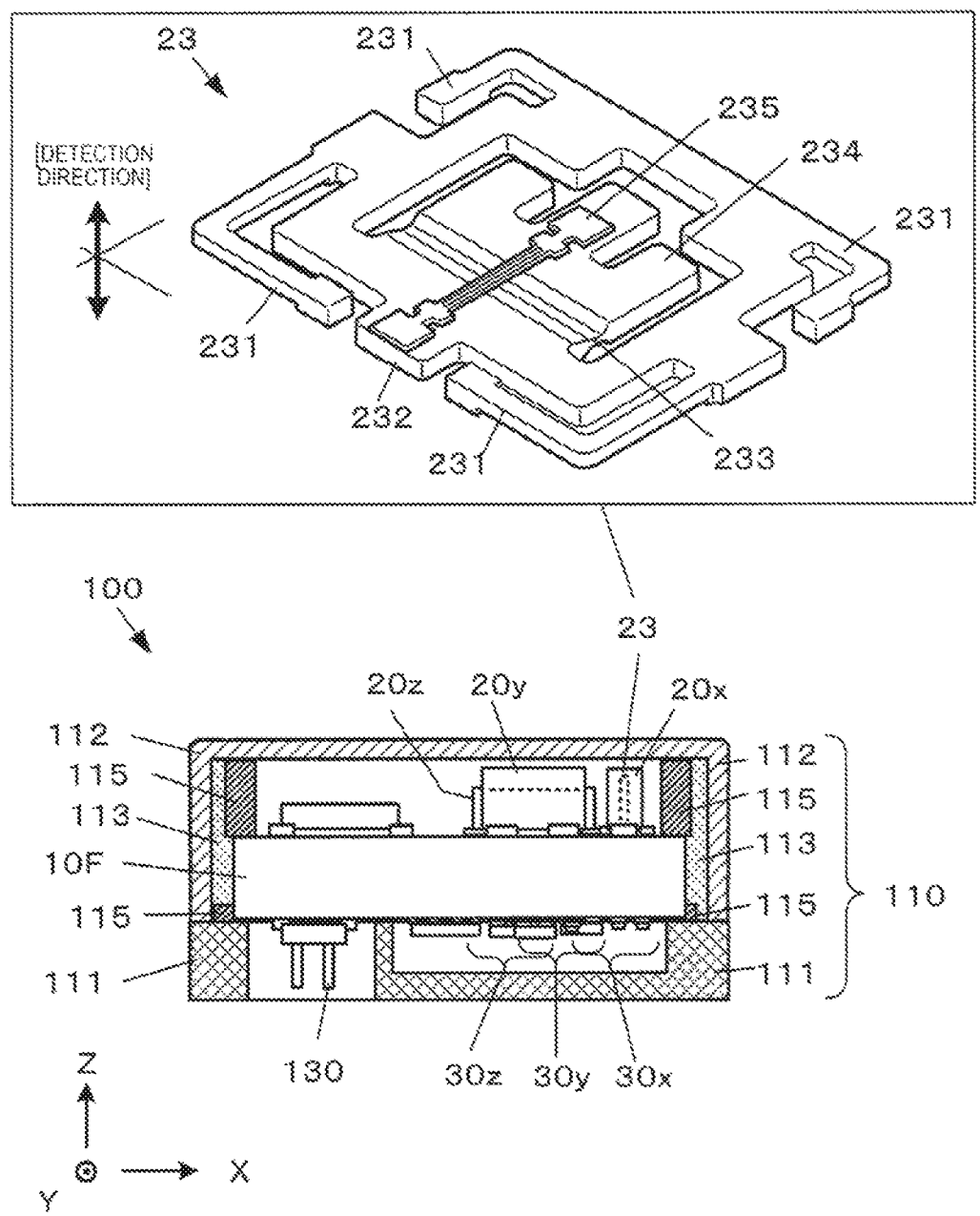
FIG. 7 is a longitudinal cross-sectional view illustrating a configuration example of an acceleration sensor.

FIG. 7 is a longitudinal cross-sectional view illustrating a configuration example of the acceleration sensor 100 according to this embodiment. However, as the drawing becomes complicated, a state of the cross section is omitted for some members such as an electronic circuit board 10F.

The acceleration sensor 100 is a physical quantity sensor that can output a signal corresponding to a predetermined physical quantity, measure accelerations in three orthogonal directions consisting of the X-axis, the Y-axis, and the Z axis, and externally output an output signal corresponding to an acceleration measurement value in each axis direction.

Specifically, the acceleration sensor 100 includes the electronic circuit board 10F having all three ground electrode configurations of the first ground electrode configuration, the second ground electrode configuration, and the third ground electrode configuration, an accommodator 110 accommodating the electronic circuit board.

The accommodator 110 defines an internal space above a lower outer case 111 by covering and sealing an upper outer case 112 that opens downward. The accommodator 110 supports and fixes the electronic circuit board 10F through an inner case 113 and a packing 115 in the internal space.

Figure 8:
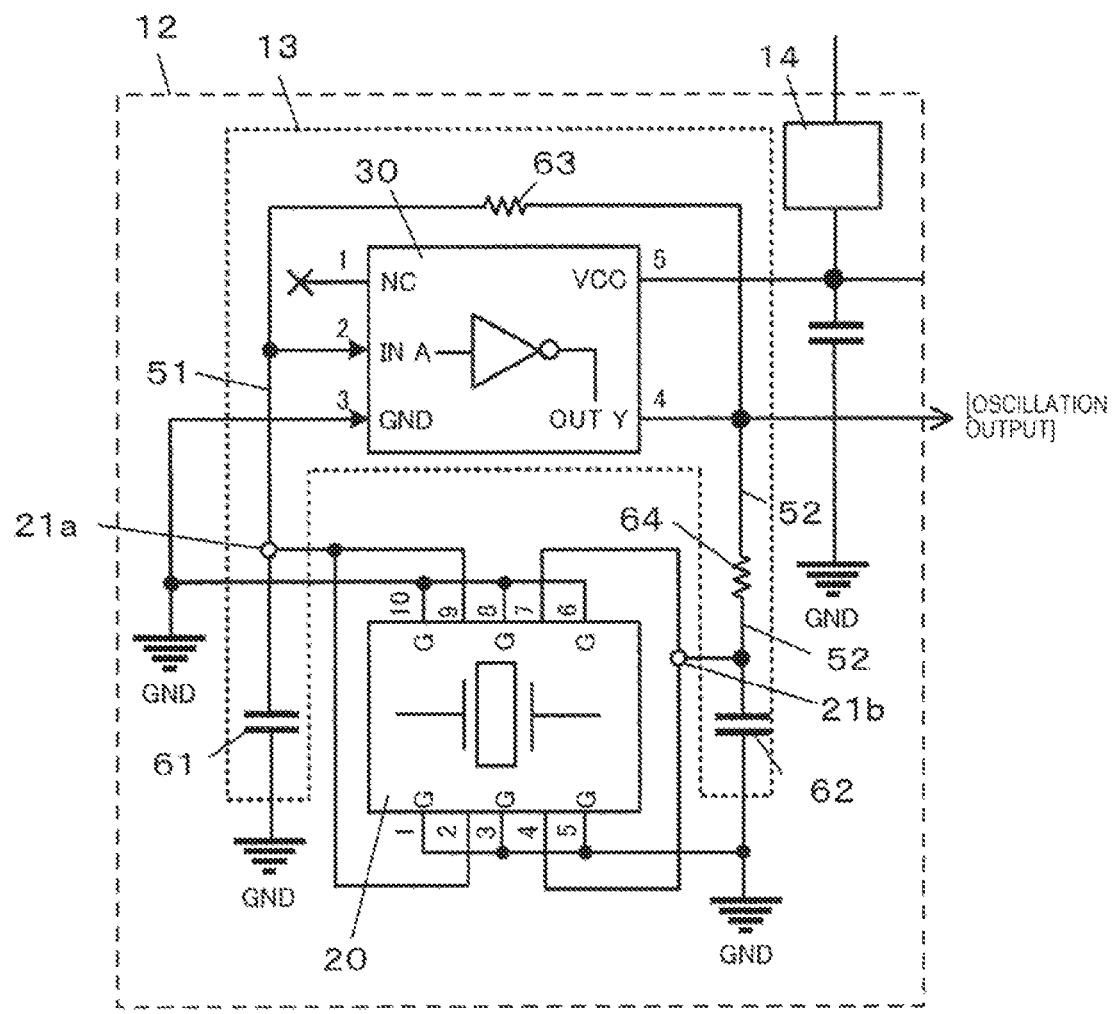
FIG. 8 is a circuit diagram illustrating a configuration example of an oscillation circuit.

Three oscillation circuits 12 of the same specification illustrated in FIG. 8 are mounted on the electronic circuit board 10F.

The electronic circuit board 10F has all the three ground electrode configurations of the first ground electrode configuration, the second ground electrode configuration, and the third ground electrode configuration, and has the configuration of the second example illustrated in FIG. 6. For that reason, an oscillator 20 (20x, 20y, and 20z) included in each oscillation circuit 12 is mounted on the n-th layer Ln, and the circuit 13 including an amplifier 30 (30x, 30y, and 30z) included in each oscillation circuit 12 is mounted on the first layer L1 (see FIG. 6).

Each of the X-axis oscillator 20x, the Y-axis oscillator 20y, and the Z-axis oscillator 20z, which are three mounted oscillators, is a physical quantity sensor element that outputs a signal corresponding to a predetermined physical quantity in this embodiment and can output a signal corresponding to acceleration in the corresponding measurement direction. The X-axis oscillator 20x, the Y-axis oscillator 20y, and the Z-axis oscillator 20z are mounted in such an attitude that their measurement directions are orthogonal to each other and accelerations in the directions of three axes orthogonal to each other can be measured with three physical quantity sensor elements.

The X-axis oscillator 20x, the Y-axis oscillator 20y, and the Z-axis oscillator 20z are configured to include a piezoelectric vibrator type physical quantity detection device 23.

Specifically, the physical quantity detection device 23 includes a base portion 232 supported on four sides by a support portion 231, a movable portion 234 which is connected by a joint portion 233 extending from the base portion 232 and bends depending on the acceleration in the detection direction, and a physical quantity detection element 235. A mass body may be attached to the movable portion 234 as desired.

The physical quantity detection element 235 is, for example, a double-ended tuning fork type vibrating element formed by patterning a quartz crystal substrate cut at a predetermined angle from a quartz crystal or the like by a photolithography technique and an etching technique. Also, a material of the physical quantity detection element 235 is not limited to quartz crystal, but piezoelectric materials such as lithium tantalate, lithium tetraborate, lithium niobate, lead zirconate titanate, zinc oxide, aluminum nitride and the like can be used. Further, a semiconductor material such as silicon having a piezoelectric material film such as zinc oxide or aluminum nitride can be used.

The physical quantity detection element 235 is formed in a beam shape so as to straddle the joint portion 233, and one end side of the beam portion is fixed to the base portion 232 and the other end side is fixed to the movable portion 234. A configuration in which signal lines (not illustrated) are connected to both end portion of the physical quantity detection element 235 and a predetermined current voltage is applied thereto and thus, the physical quantity detection element 235 vibrates at a predetermined frequency is adopted. Then, when a stress acts on the beam portion of the physical quantity detection element 235 due to the movable portion 234 being bent by the acceleration generated in the measurement direction, the vibration frequency of the physical quantity detection element 235 changes. Based on change in the vibration frequency, a signal corresponding to the acceleration is generated and output as the output signal of the oscillator 20.

The electronic circuit board 10F includes an external output terminal 130 exposed to an opening of the lower outer case 111, and output signals from the respective oscillators 20 of the X-axis oscillator 20x, the Y-axis oscillator 20y, and the Z-axis oscillator 20z can be externally output.

FIG. 8 is a circuit diagram illustrating a configuration example of the oscillation circuit 12 in this embodiment. The oscillation circuit 12 of this embodiment includes the oscillator 20, the circuit 13 including the amplifier 30, and a regulator 14 that supplies power to the oscillation circuit 12. The circuit 13 including the amplifier 30 includes the amplifier 30, a first capacitor 61, a second capacitor 62, a feedback resistor 63, and an amplitude limiting resistor 64. Among the elements, the oscillator 20 is mounted on the n-th layer Ln, and the circuit 13 including the amplifier 30 and the regulator 14 are mounted on the first layer L1. The configuration of the second example described with reference to FIG. 6 is obtained.

Figure 9:
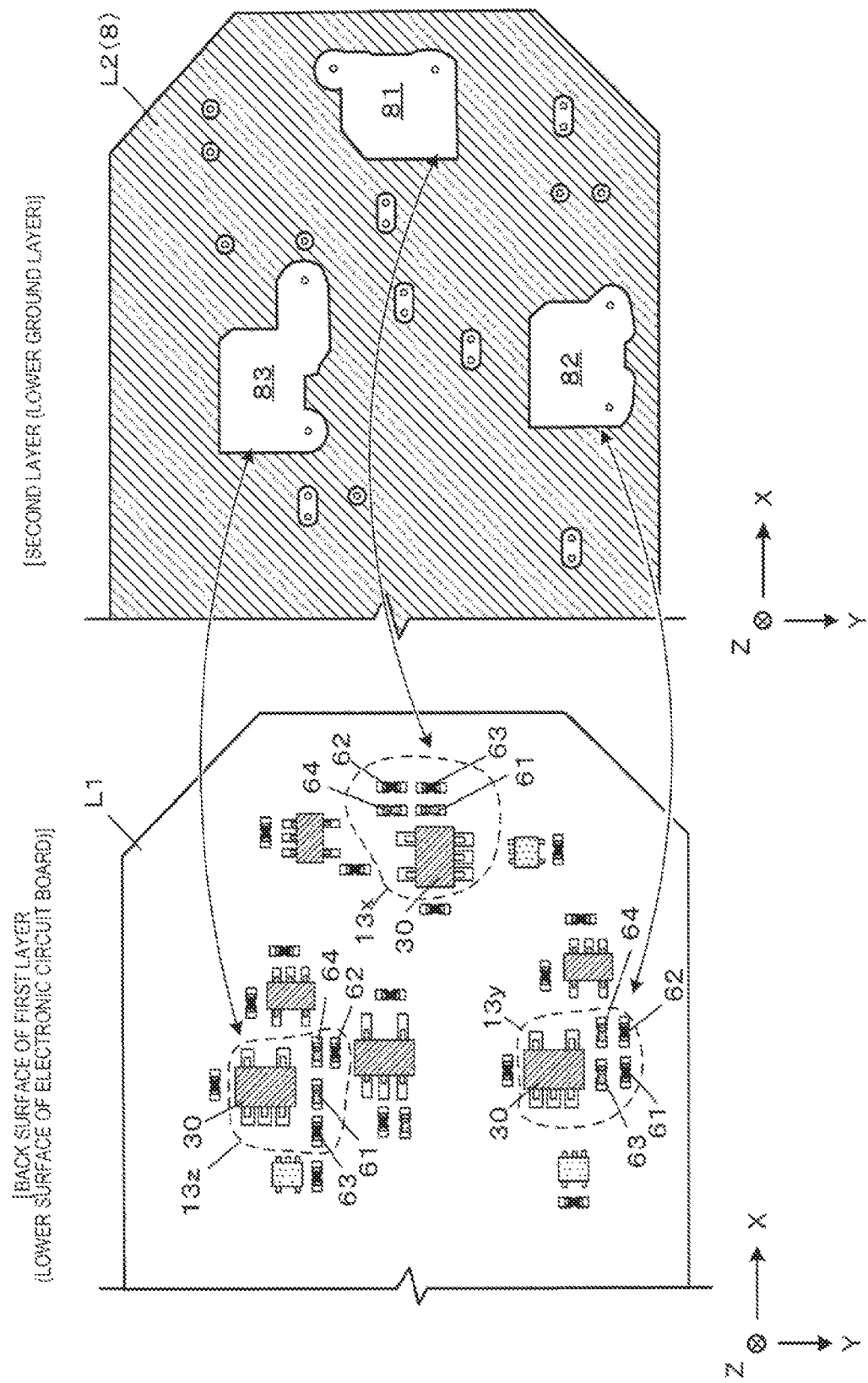
FIG. 9 is a view illustrating amounting example in a first layer and an example of formation of a lower ground layer in a second layer, and a view for explaining a mutual positional relationship.

FIG. 9 is a view illustrating a mounting example in the first layer L1 and an example of formation of a lower ground layer in the second layer L2, and for explaining a mutual positional relationship.

On the first layer L1, a circuit 13x including an X-axis amplifier 30 corresponding to the X-axis oscillator 20x, a circuit 13y including a Y-axis amplifier 30 corresponding to the Y-axis oscillator 20y, a circuit 13z including a Z-axis amplifier 30 corresponding to the Z-axis oscillator 20z are mounted.

The closest ground layer to these circuits is the lower ground layer 8 of the second layer L2.

The lower ground layer 8 is so-called "ground solid", but the ground electrode is not formed for a first non-forming region 81, a second non-forming region 82, and a third non-forming region 83.

A first non-forming region 81 is a region that overlaps the circuit 13x including the amplifier 30 for the X-axis in a plan view when viewed in a direction perpendicular to the substrate surface. That is, the first non-forming region 81 is a region that overlaps the pad 43 for soldering the amplifier 30 in a plan view when viewed in the direction perpendicular to the substrate surface, and is a region which overlaps the input portion and the output portion of the amplifier 30 for the X-axis soldered to the pad in a plan view when viewed in the direction perpendicular to the substrate surface. In this embodiment, the first wiring 51 and the second wiring 52 for the amplifier 30 for the X-axis are overlapped in a plan view when viewed in the direction perpendicular to the substrate surface.

A second non-forming region 82 is a region that overlaps the circuit 13y including the amplifier 30 for the Y-axis in a plan view when viewed in a direction perpendicular to the substrate surface. That is, the second non-forming region 82 is a region that overlaps the pad 43 for soldering the amplifier 30 in a plan view when viewed in the direction perpendicular to the substrate surface, and is a region which overlaps the input portion and the output portion of the amplifier 30 for the Y-axis soldered to the pad in a plan view when viewed in the direction perpendicular to the substrate surface. In this embodiment, the first wiring 51 and the second wiring 52 for the amplifier 30 for the Y-axis are overlapped in a plan view when viewed in the direction perpendicular to the substrate surface.

A third non-forming region 83 is a region that overlaps the circuit 13z including the amplifier 30 for the Z-axis in a plan view when viewed in a direction perpendicular to the substrate surface. That is, the third non-forming region 83 is a region that overlaps the pad 43 for soldering the amplifier 30 in a plan view when viewed in the direction perpendicular to the substrate surface, and is a region which overlaps the input portion and the output portion of the amplifier 30 for the Z-axis soldered to the pad in a plan view when viewed in the direction perpendicular to the substrate surface. In this embodiment, the first wiring 51 and the second wiring 52 for the amplifier 30 for the Z-axis are overlapped in a plan view when viewed in the direction perpendicular to the substrate surface.

Figure 10:
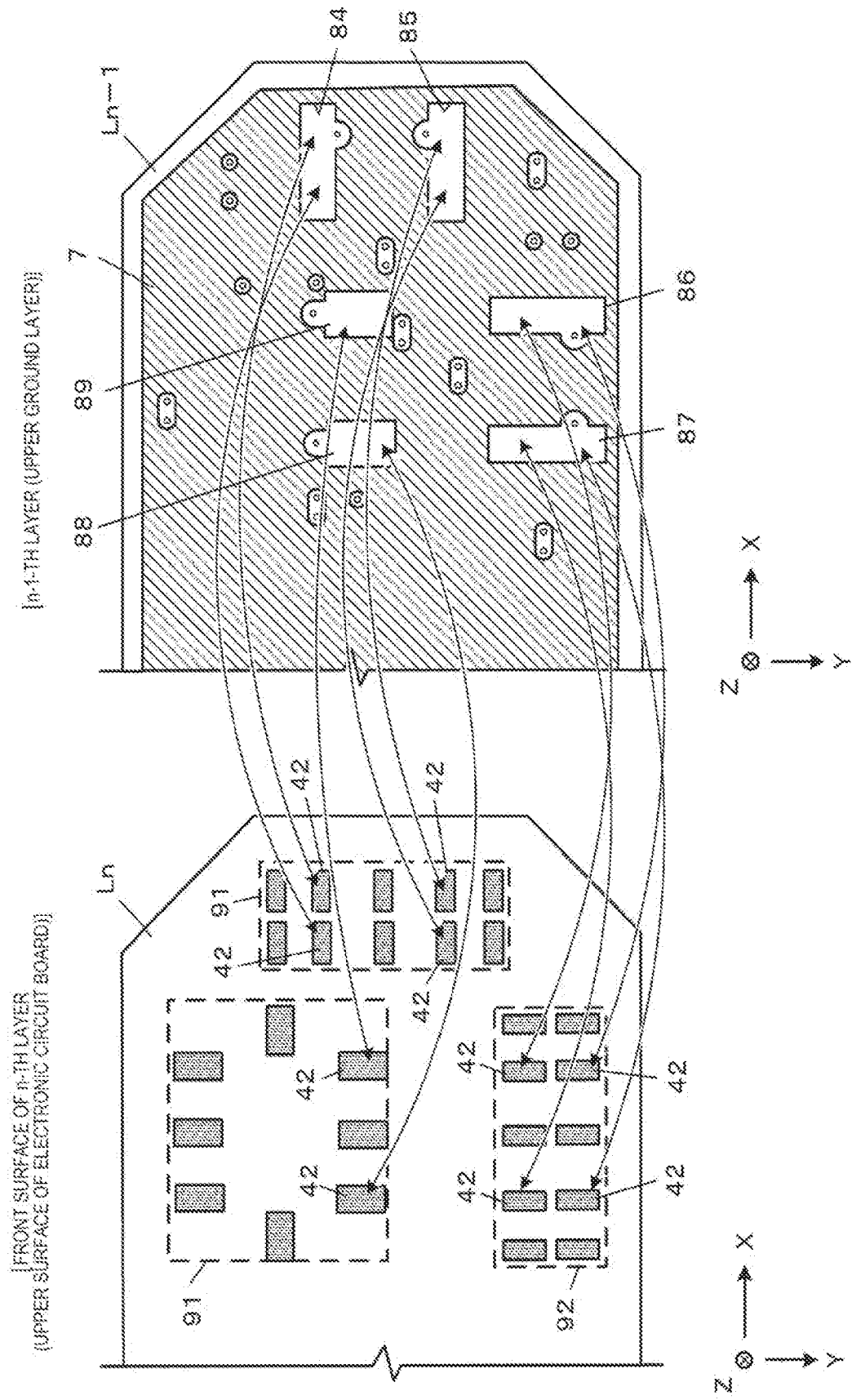
FIG. 10 is a view illustrating an example of arrangement of pads in an n-th layer and an example of formation of an upper ground layer in an n−1-th layer and a view for explaining a mutual positional relationship.

FIG. 10 is a view illustrating an example of arrangement of pads in the n-th layer Ln and an example of formation of an upper ground layer in the n−1-th layer Ln−1 and for explaining a mutual positional relationship.

In the n-th layer Ln, a first pad group 91 including a plurality of pads (hatched rectangles in FIG. 10) for soldering the X-axis oscillator 20x, a second pad group 92 including a plurality of pads for soldering the Y-axis oscillator 20y, and a third pad group 93 including a plurality of pads for soldering the Z-axis oscillator 20z are provided.

The ground layer closest to the pads included in these pad groups and the oscillators 20 in each axis to be mounted is the upper ground layer 7. In the upper ground layer 7, an electrode is not formed in a fourth non-forming region 84, a fifth non-forming region 85, a sixth non-forming region 86, a seventh non-forming region 87, an eighth non-forming region 88, and a ninth non-forming region 89.

The fourth non-forming region 84 and the fifth non-forming region 85 are regions overlapping the pad 42 for soldering the so-called hot terminal which is the signal terminal 21 among the pads of the first pad group 91 in a plan view when viewed in a direction perpendicular to the substrate surface. Also, the fourth and fifth non-forming regions 84 and 85 are regions overlapping the signal terminal 21 of the X-axis oscillator 20x soldered to the pad in a plan view when viewed in the direction perpendicular to the substrate surface. Further, in this embodiment, the first wiring 51 and the second wiring 52 for the X-axis oscillator 20x are overlapped in a plan view when viewed in the direction perpendicular to the substrate surface.

The sixth non-forming region 86 and the seventh non-forming region 87 are regions overlapping the pad for soldering the so-called hot terminal which is the signal terminal 21 among the pads of the second pad group 92 in a plan view when viewed in the direction perpendicular to the substrate surface. Also, the sixth and seventh non-forming regions 86 and 87 are regions overlapping the signal terminal 21 of the Y-axis oscillator 21y soldered to the pad in a plan view when viewed in the direction perpendicular to the substrate surface. Further, in this embodiment, the first wiring 51 and the second wiring 52 for the Y-axis oscillator 20y are overlapped in a plan view when viewed in the direction perpendicular to the substrate surface.

The eighth non-forming region 88 and the ninth non-forming region 89 are regions overlapping the pad for soldering the so-called hot terminal which is the signal terminal 21 among the pads of the third pad group 93 in a plan view when viewed in the direction perpendicular to the substrate surface. Also, the eighth and ninth non-forming regions 88 and 89 are regions overlapping the signal terminal 21 of the Z-axis oscillator 20z soldered to the pad in a plan view when viewed in the direction perpendicular to the substrate surface. Further, in this embodiment, the first wiring 51 and the second wiring 52 for the Z-axis oscillator 20z are overlapped in a plan view when viewed in the direction perpendicular to the substrate surface.

Figure 11:
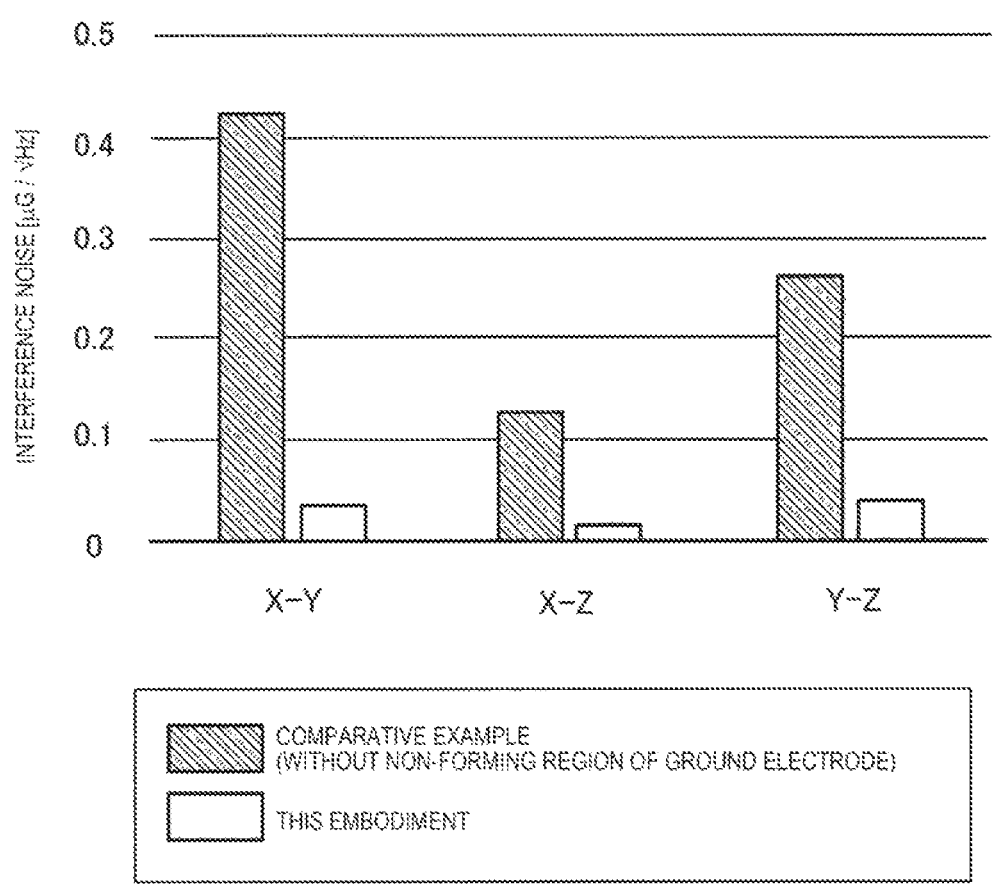
FIG. 11 is a graph illustrating magnitude of interference noise.

FIG. 11 is a graph illustrating the magnitude of interference noise when two of X-axis direction acceleration, Y-axis direction acceleration, and Z-axis direction acceleration are combined in this embodiment having three ground electrode configurations of the first ground electrode configuration, the second ground electrode configuration, and the third ground electrode configuration, and a comparative example in the case of not providing a non-forming region of the ground electrode.

As is apparent from FIG. 11, by providing three ground electrode configurations of the first ground electrode configuration, the second ground electrode configuration, and the third ground electrode configuration, it can be seen that noise can be reduced much more than in the case where three ground electrode configurations are not provided. Due to this noise reduction effect, noise included in the output signal of the oscillator 20 and noise contained in the output signal of the acceleration sensor 100 are reduced, and as a result, the acceleration sensor 100 can measure acceleration more accurately than in the related art.

Although the electronic circuit board 10F of the acceleration sensor 100 according to this embodiment has three configurations of the first ground electrode configuration, the second ground electrode configuration, and the third ground electrode configuration, it is possible to change the electronic circuit board 10F to an electronic circuit board in which one or two electrode configurations among the three electrode configurations are omitted.

Second Embodiment

Next, a second embodiment will be described. In the following description, differences from the first embodiment will be mainly described, and the same reference numerals are given to the same components as those in the first embodiment, and redundant descriptions will be omitted.

Figure 12:
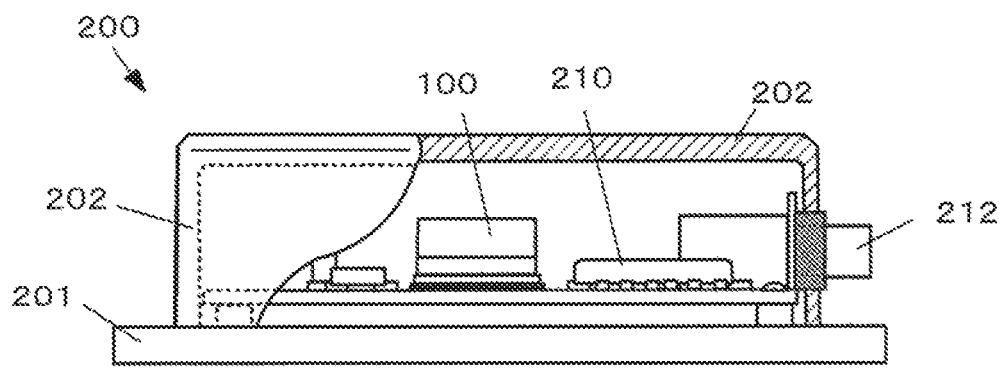
FIG. 12 is a view illustrating a configuration example of an inclinometer.

FIG. 12 is a view illustrating a configuration example of the inclinometer, and is a side view illustrating a partial cross-section.

The inclinometer 200 is a device that outputs a signal corresponding to an inclination angle of a position where the inclinometer 200 is installed. Specifically, the inclinometer 200 includes the acceleration sensor 100 of the first embodiment and a calculator 210 for calculating the inclination angle based on an output signal of the acceleration sensor 100, and an external output terminal 212 for outputting a signal corresponding to the inclination angle calculated by the calculator 210 to the outside in an inner space defined by an under case 201 and an upper case 202. Also, elements other than these elements can be included as desired. For example, a built-in battery, a power supply circuit, a wireless device, and the like can be included.

The calculator 210 is a circuit that computes the inclination angle from the output signal of the acceleration sensor 100 and outputs a signal corresponding to the inclination angle, and can be realized by, for example, a general purpose IC (Integrated Circuit), a field programmable gate array (FPGA), or the like.

According to the inclinometer 200 of this embodiment, since the acceleration sensor 100 of the first embodiment is used, noise components contained in an internal signal and the output signal of the acceleration sensor 100 is reduced as compared with the related art, it is possible to improve accuracy of inclination measurement as compared with the inclinometer of the related art.

Third Embodiment

Next, a third embodiment will be described. In the following description, differences from the first and second embodiments will be mainly described, and the same reference numerals are given to the same components as those in the first and second embodiments, and redundant description will be omitted.

Figure 13:
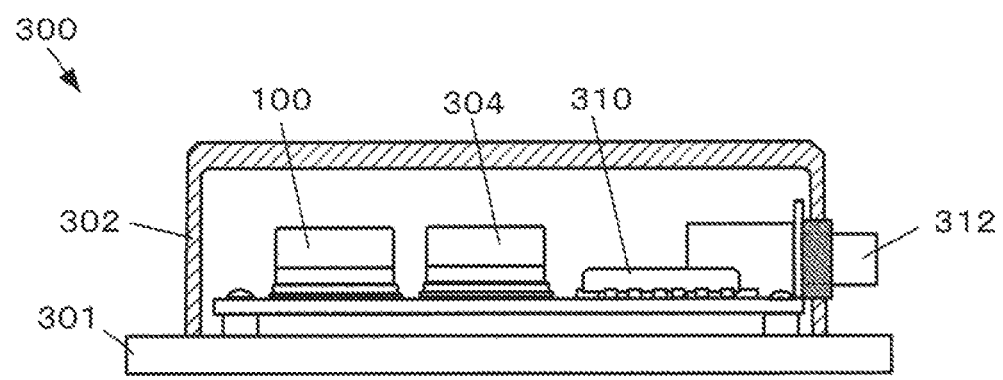
FIG. 13 is a view illustrating a configuration example of an inertial navigation device.

FIG. 13 is a view illustrating a configuration example of an inertial navigation device, and is a side view illustrating a partial cross-section.

The inertial navigation device 300 is an inertial navigation device attached to a moving body, and includes the acceleration sensor 100 according to the first embodiment, an angular velocity sensor 304, a circuit unit 310 for calculating an attitude of the vehicle based on the output signal of the acceleration sensor 100 and the output signal of the angular velocity sensor 304, and an external output terminal 312 for outputting a signal corresponding to the attitude calculated by the circuit unit 310 to the outside in the inner space defined by an under case 301 and an upper case 302. Also, elements other than these elements can be included as desired. For example, a built-in battery, a power supply circuit, a wireless device, and the like can be included.

Basically, the angular velocity sensor 304 has the same configuration as the acceleration sensor 100 of the first embodiment, and can output the signal according to the angular velocity using the electronic circuit board 10F of the first embodiment.

The circuit unit 310 is realized by, for example, a general purpose IC (Integrated Circuit) or a field programmable gate array (FPGA), calculates the attitude the vehicle to which the inertial navigation device 300 is attached from the output signal of the acceleration sensor 100 and the output signal of the angular velocity sensor 304, and outputs a signal corresponding to the attitude.

According to the inertial navigation device 300 of this embodiment, since the acceleration sensor 100 of the first embodiment is used, the noise components contained in the internal signal and the output signal of the acceleration sensor 100 are reduced and thus, accuracy of attitude measurement of the vehicle can be improved as compared with the inertial navigation device of the related art.

Fourth Embodiment

Next, a fourth embodiment will be described. In the following description, differences from the first to third embodiments will be mainly described, and the same reference numerals are given to the same components as those in the first to third embodiments, and redundant description will be omitted.

Figure 14:
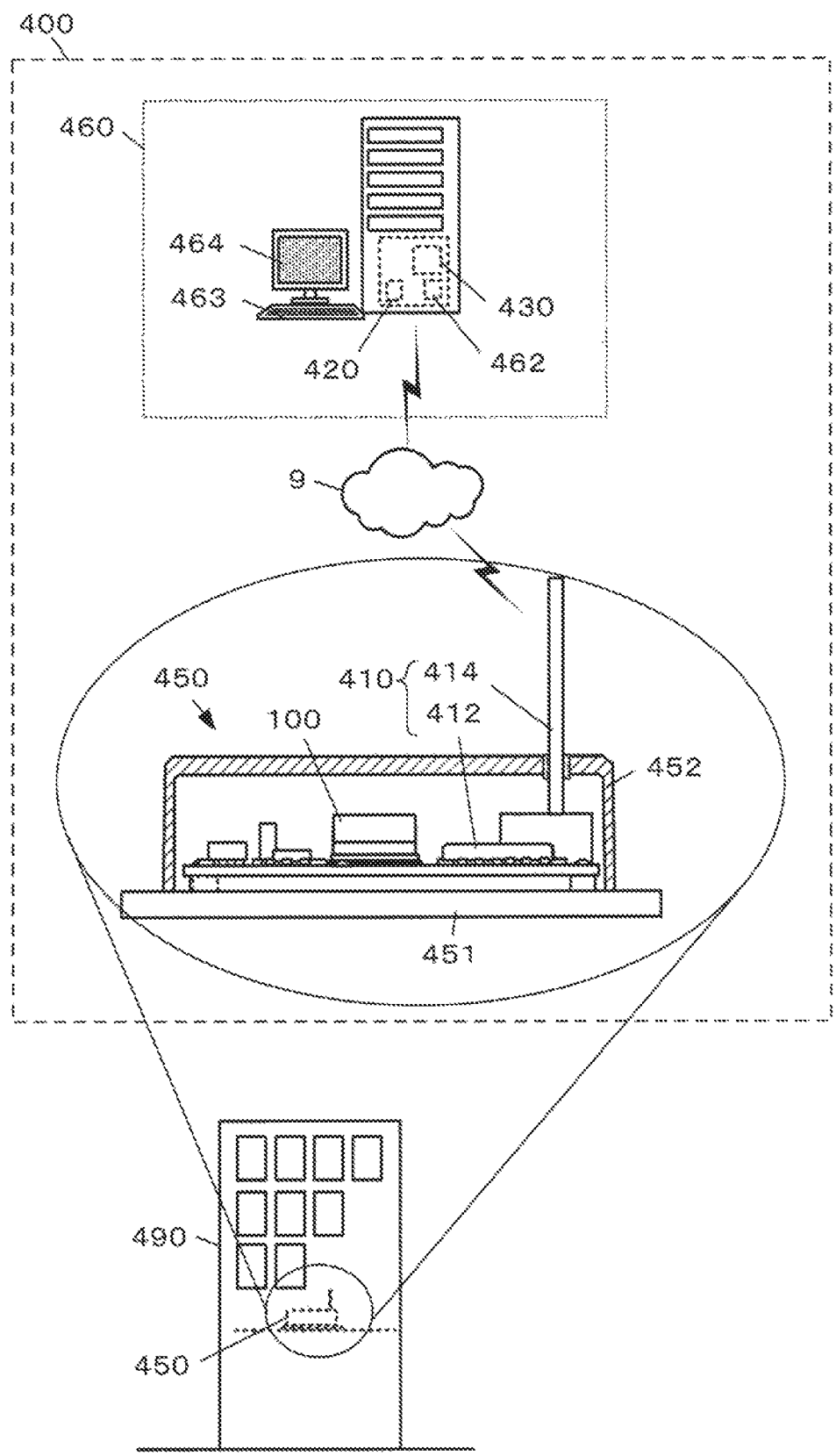
FIG. 14 is a view illustrating a configuration example of a structure monitoring device.

FIG. 14 is a view illustrating a configuration example of a structure monitoring device.

The structure monitoring device 400 includes the acceleration sensor 100 of the first embodiment attached to a structure 490 which a monitoring target, a transmitter 410 for transmitting a detection signal of the acceleration sensor 100 attached to the structure 490, a receiver 420 for receiving a transmission signal from the transmitter 410, and a calculator 430 for calculating the inclination angle of the structure 490 based on a received signal of the receiver 420. A communication network 9 may be either a wired network or wireless network.

The transmitter 410 is realized by, for example, a wired communication device or a wireless communication device connected to the communication network 9. In this embodiment, an acceleration sensor unit 450 is configured such that the acceleration sensor 100 and the transmitter 410 including a communication module 412 that realizes a function as a small communication terminal and an antenna 414 are mounted in an internal space defined by an under case 451 and an upper case 452. Also, the transmitter 410 may be realized as a communication module and an antenna separate from the acceleration sensor 100.

In this embodiment, the calculator 430 is realized by an application specific integrated circuit (ASIC), field programmable gate array (FPGA) or the like mounted on a monitoring computer 460. However, a configuration in which the calculator 430 is realized in software by allowing a program stored in an IC memory 462 to be subjected to arithmetic processing by a processor such as a central processing unit (CPU) may be adopted. The monitoring computer 460 can receive various operation inputs of an operator through a keyboard 463 and can display the result of the arithmetic processing on a touch panel 464.

The receiver 420 is realized by a wired communication device or a wireless communication device connected to the communication network 9. In this embodiment, the receiver 420 is realized by a wireless module and an antenna that perform wireless communication with the transmitter 410, but the receiver 420 may be realized as a communication module and an antenna separate from the monitoring computer 460.

According to the structure monitoring device 400 of this embodiment, inclination of the structure 490 is monitored using the acceleration sensor 100 of the first embodiment. For that reason, it is possible to use highly accurate acceleration detection which is an operation effect of the acceleration sensor 100 of the first embodiment it becomes possible to accurately detect the inclination of the structure 490 to be monitored so that a monitoring quality of the structure 490 can be improved.

Fifth Embodiment

Next, a fifth embodiment will be described. In the following description, differences from the first to fourth embodiments will be mainly described, and the same reference numerals are given to the same components as those in the first to fourth embodiments, and redundant description will be omitted.

Figure 15:
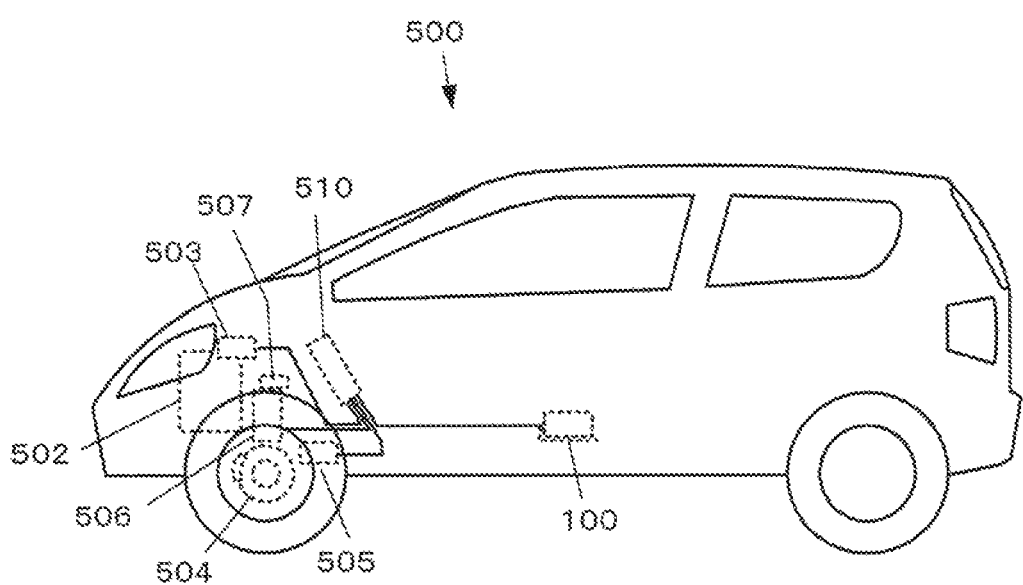
FIG. 15 is a view illustrating a configuration example of a vehicle.

FIG. 15 is a view illustrating a configuration example of a vehicle. In this embodiment, although a vehicle 500 is exemplified as a passenger car, a vehicle type can be changed. The vehicle 500 may be a small boat, an automatic transporting device, an in-yard transporting vehicle, a forklift, or the like.

The vehicle 500 includes the acceleration sensor 100 of the first embodiment and a controller 510 that controls at least one of acceleration, braking, and steering based on a detection signal of the acceleration sensor 100, and can switch execution or non-execution of the automatic operation based on the detection signal of the acceleration sensor 100.

The controller 510 is realized by an in-vehicle computer. The controller 510 is connected to various sensors and controllers such as the acceleration sensor 100, a throttle controller 503, a brake controller 505, a steering controller 507, and the like through a communication network such as an in-vehicle local area network (LAN) so that signals can be transmitted and received to and from the controller 510 and the sensors and controllers and vice versa. Here, the throttle controller 503 is a device that controls output of the engine 502. The brake controller 505 is a device that controls an operation of the brake 504. The steering controller 507 is a device that controls an operation of the power steering 506. The types of sensors and controllers connected to the controller 510 are not limited to the sensor and controllers, and can be set as desired.

Then, the controller 510 is a built-in arithmetic device, and performs arithmetic processing based on the detection signal of the acceleration sensor 100 to determine whether the automatic operation is to be executed or not. In a case where the automatic operation is to be executed, the controller 510 transmits a control command signal to at least one of the throttle controller 503, the brake controller 505, and the steering controller 507, and controls at least one of acceleration, braking, and steering.

The contents of the automatic control can be set as desired. For example, in a case where acceleration detected by the acceleration sensor 100 reaches a threshold value that is considered to cause spin or corner-out during cornering, control may be performed to prevent spin or corner-out. In a case where the acceleration detected by the acceleration sensor 100 reaches a threshold value which is considered to have a possibility that a sudden forward or backward movement occurs due to an erroneous operation during stop, control may be performed such that the throttle is forcibly fully closed and sudden braking is forcibly activated.

According to the vehicle 500 of this embodiment, it is possible to switch execution or non-execution of the automatic operation based on the detection signal of the acceleration sensor 100 of the first embodiment. For that reason, it is possible to utilize highly accurate acceleration detection which is an operation effect of the acceleration sensor 100 of the first embodiment, and it becomes possible to more precisely determine switching of execution or non-execution of automatic operation.

MODIFICATION EXAMPLE

Embodiments to which the invention can be applied are not limited to the embodiments described above, but can be changed within a range not departing from the gist of the invention.

Modification Example 1

For example, in the electronic circuit board of the embodiments described above, with respect to the plurality of oscillators 20 mounted on the electronic circuit board, a wiring configuration in which the ground wirings of the respective oscillators 20 are independently provided and are separately connected to a common ground portion can be adopted.

Figure 16:
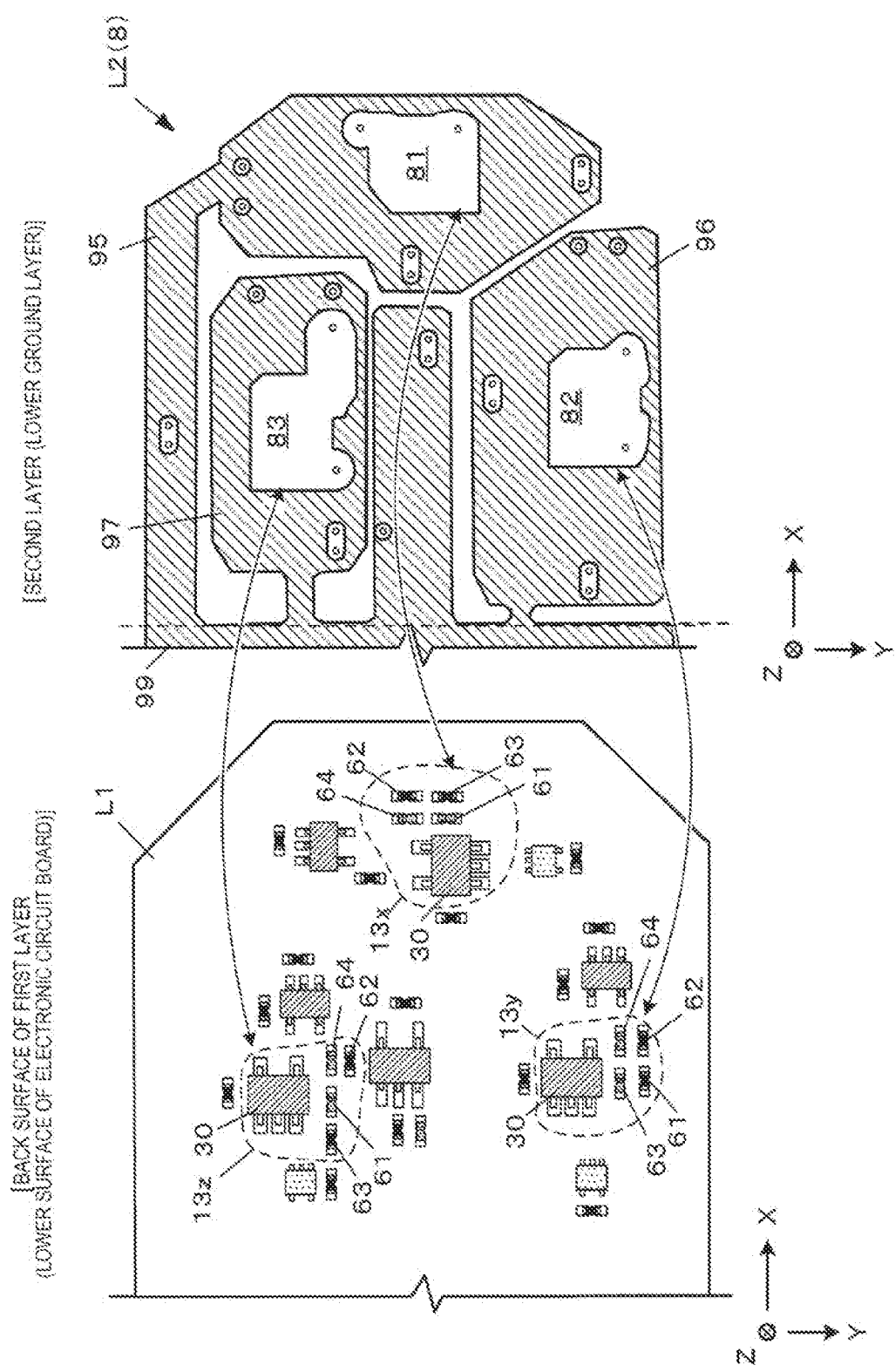
FIG. 16 is a view illustrating an example of formation of a ground wiring.

As a specific example based on the example of FIG. 9, for example, as illustrated in FIG. 16, an X-axis ground wiring 95 is formed so as to surround the first non-forming region 81 and connected to a common ground portion 99. A Y-axis ground wiring 96 is formed so as to surround the second non-forming region 82 and connected to the common ground portion 99. Further, a Z-axis ground wiring 97 is formed so as to surround the third non-forming region 83 and connected to the common ground portion 99.

The entire disclosure of Japanese Patent Application No. 2018-028930, filed Feb. 21, 2018 is expressly incorporated by reference herein.

What is claimed is:

1. An electronic circuit board comprising:
a substrate having a multilayer structure including at least one ground layer; and
an oscillation circuit provided on the substrate,
wherein the oscillation circuit includes an oscillator and a circuit including an amplifier electrically connected to each other, the oscillator and the amplifier each including an electrically conductive bump, and
a ground layer closest to the oscillation circuit in the multilayer structure includes a plurality of apertures formed therein that correspond to locations of the electrically conducive bumps in a plan view of the electronic circuit board,
wherein edges of the apertures entirely surround and are spaced apart from the electrically conductive bumps in the plan view of the electronic circuit board.

2. An electronic circuit board comprising:
a substrate having a multilayer structure including at least one ground layer; and
an oscillation circuit provided on the substrate,
wherein the oscillation circuit includes an oscillator and a circuit including an amplifier electrically connected to each other, the oscillator and the amplifier each including an electrically conductive bump connected to a wiring that electrically connects the electrically conductive bump of the oscillator to the electrically conductive bump of the amplifier, and
a ground layer closest to the oscillation circuit in the multilayer structure includes a plurality of apertures formed therein that correspond to locations of the electrically conductive bumps and the wiring in a plan view of the electronic circuit board,
wherein edges of the apertures entirely surround and are spaced apart from each of the electrically conductive bumps and the wiring in the plan view of the electronic circuit board.

3. An electronic circuit board comprising:
a substrate having a multilayer structure including at least one ground layer; and
an oscillation circuit provided on the substrate,
wherein the oscillation circuit includes an oscillator and a circuit including an amplifier electrically connected to each other, the oscillator including an input terminal and the amplifier including an output terminal connected to each other by a wiring, and
a ground layer closest to the oscillation circuit includes an aperture therein that corresponds to locations of the input terminal, the output terminal and the wiring in a plan view of the electronic circuit board,
wherein an edge of the aperture entirely surrounds and is spaced apart from each of the input terminal, the output terminal, and the wiring in the plan view of the electronic circuit board.

4. An electronic circuit board comprising:
a substrate having an upper major surface and an opposite second major surface, the substrate having a multilayer structure including a first ground layer, a second ground layer, and a third ground layer; and
an oscillation circuit provided on the substrate,
wherein the oscillation circuit includes an oscillator formed on the upper major surface of the substrate and a circuit including an amplifier formed on the opposite second major surface, the oscillator having a first electrically conductive bump attached to a first wiring that electrically connects the oscillator to an input conductive bump of the amplifier, and the oscillator having a second electrically conductive bump attached to a second wiring that electrically connects the oscillator to an output bump of the amplifier,
the first ground layer closest to the oscillator includes a first aperture formed therein that corresponds to locations of the first and second electrically conductive bumps of the oscillator in a plan view of the electronic circuit board, and an edge of the first aperture entirely surrounding and being spaced apart from the first and second electrically conductive bumps in the plan view,
the second ground layer closest to the first wiring includes a second aperture formed therein that corresponds to a location of the first wiring in the plan view, an edge of the second aperture entirely surrounding and being spaced apart from the first wiring in the plan view, and
the third ground layer closest to the second wiring includes a third aperture formed therein that corresponds to a location of the second wiring in the plan view, an edge of the third aperture entirely surrounding and being spaced apart from the second wiring in the plan view.

5. The electronic circuit board according to claim 1, wherein the circuit includes a pad, and edges of the aperture that corresponds to the electrically conductive bump of the amplifier entirely surround the pad in the plan view of the electronic circuit board.

6. The electronic circuit board according to claim 2, wherein the circuit includes a pad, and edges of the aperture that corresponds to the electrically conductive bump of the amplifier entirely surround the pad in the plan view of the electronic circuit board.

7. The electronic circuit board according to claim 3, wherein the circuit includes a pad, and edges of the aperture that corresponds to the electrically conductive bump of the amplifier entirely surround the pad in the plan view of the electronic circuit board.

8. The electronic circuit board according to claim 4, further comprising a fourth ground layer closest to a pad of the circuit, the fourth ground layer including an aperture formed therein that corresponds to a location of the pad in the plan view of the electronic circuit board, and edges of the aperture entirely surround and are spaced apart from the pad in the plan view of the electronic circuit board.

9. The electronic circuit board according to claim 1, wherein a plurality of the oscillation circuits are provided, and
a ground wiring of each oscillator is independently connected to a common ground.

10. The electronic circuit board according to claim 2, wherein a plurality of the oscillation circuits are provided, and
a ground wiring of each oscillator is independently connected to a common ground.

11. The electronic circuit board according to claim 3, wherein a plurality of the oscillation circuits are provided, and
a ground wiring of each oscillator is independently connected to a common ground.

12. The electronic circuit board according to claim 4, wherein a plurality of the oscillation circuits are provided, and
a ground wiring of each oscillator is independently connected to a common ground.

13. The electronic circuit board according to claim 12, wherein a regulator for supplying power to the oscillation circuit is provided for each oscillation circuit.

14. The electronic circuit board according to claim 1, wherein the oscillator is a physical quantity sensor element that outputs a signal corresponding to a predetermined physical quantity.

15. The electronic circuit board according to claim 14, wherein the physical quantity is acceleration.

16. An acceleration sensor comprising:
the electronic circuit board according to claim 15; and
an accommodator accommodating the electronic circuit board.

17. An inclinometer comprising:
the acceleration sensor according to claim 16; and
a calculator that calculates an inclination angle based on an output signal of the acceleration sensor.

18. An inertial navigation device attached to a vehicle, comprising:
the acceleration sensor according to claim 16;
an angular velocity sensor; and
a circuit unit for calculating an attitude of the vehicle based on an output signal of the acceleration sensor and an output signal of the angular velocity sensor.

19. A structure monitoring device comprising:
the acceleration sensor according to claim 16 attached to a structure;
a transmitter attached to the structure and transmitting a detection signal of the acceleration sensor;
a receiver that receives a transmission signal from the transmitter; and
a calculator that calculates an inclination angle of the structure based on a received signal of the receiver.

20. A vehicle comprising:
the acceleration sensor according to claim 16; and
a controller that controls at least one of acceleration, braking, and steering based on a detection signal of the acceleration sensor,
wherein switching of the execution or non-execution of an automatic operation is performed based on the detection signal of the acceleration sensor.

* * * * *